United States Patent
Dusmez

(10) Patent No.: US 11,239,747 B2
(45) Date of Patent: Feb. 1, 2022

(54) CURRENT SENSING APPARATUS IN POWER FACTOR CORRECTION CIRCUITS AND RELATED METHODS

(71) Applicant: Texas Instruments Incorporated, Dallas, TX (US)

(72) Inventor: Serkan Dusmez, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/710,851

(22) Filed: Dec. 11, 2019

(65) Prior Publication Data
US 2021/0184565 A1    Jun. 17, 2021

(51) Int. Cl.
*H02M 1/42* (2007.01)
*G01R 1/20* (2006.01)
*G01R 19/00* (2006.01)
*H02M 1/00* (2006.01)

(52) U.S. Cl.
CPC .......... *H02M 1/4225* (2013.01); *G01R 1/203* (2013.01); *G01R 19/0092* (2013.01); *H02M 1/0009* (2021.05)

(58) Field of Classification Search
CPC .... H02M 4/42; H02M 1/4208; H02M 1/4216; H02M 1/4225; H02M 1/4233; H02M 1/4241; H02M 1/425; H02M 1/4258
See application file for complete search history.

(56) References Cited

U.S. PATENT DOCUMENTS

| 5,654,880 A | * | 8/1997 | Brkovic | H02M 1/4258 363/17 |
| 10,582,578 B2 | * | 3/2020 | Ekbote | H05B 45/375 |
| 2015/0263605 A1 | * | 9/2015 | Alam | H02M 1/44 363/21.02 |
| 2015/0318780 A1 | * | 11/2015 | Davila | H02M 1/4225 363/89 |

OTHER PUBLICATIONS

Liu Xuechao, Wang Zhihao, "UCC28070 Implement Bridgeless Power Factor Correction (PFC) Pre-Regulator Design," Texas Instruments Application Report, Jul. 2009 (13 pages).
Salil Chellappan, "A comparative analysis of topologies for a bridgeless-boost PFC circuit," Texas Instruments Analog Design Journal, retrieved on Dec. 11, 2019 (5 pages).
Bingyao Sun, "Does GaN Have a Body Diode?—Understanding the Third Quadrant Operation of GaN," Texas Instruments Application Report, Feb. 2019 (7 pages).

* cited by examiner

*Primary Examiner* — Adolf D Berhane
*Assistant Examiner* — Afework S Demisse
(74) *Attorney, Agent, or Firm* — Michelle F. Murray; Charles A. Brill; Frank D. Cimino

(57) ABSTRACT

Current sensing apparatus in power factor correction circuits and related methods are disclosed. An example power factor correction circuit includes a first Gallium Nitride (GaN) transistor having a first current terminal and a second current terminal, a second GaN transistor having a third current terminal and a fourth current terminal, a first diode having a first anode, a second diode having a second anode, the second anode coupled to the first anode, and a resistor having a first terminal and a second terminal, the first terminal coupled to the second current terminal and the fourth current terminal, the second terminal coupled to the first anode and the second anode.

17 Claims, 11 Drawing Sheets

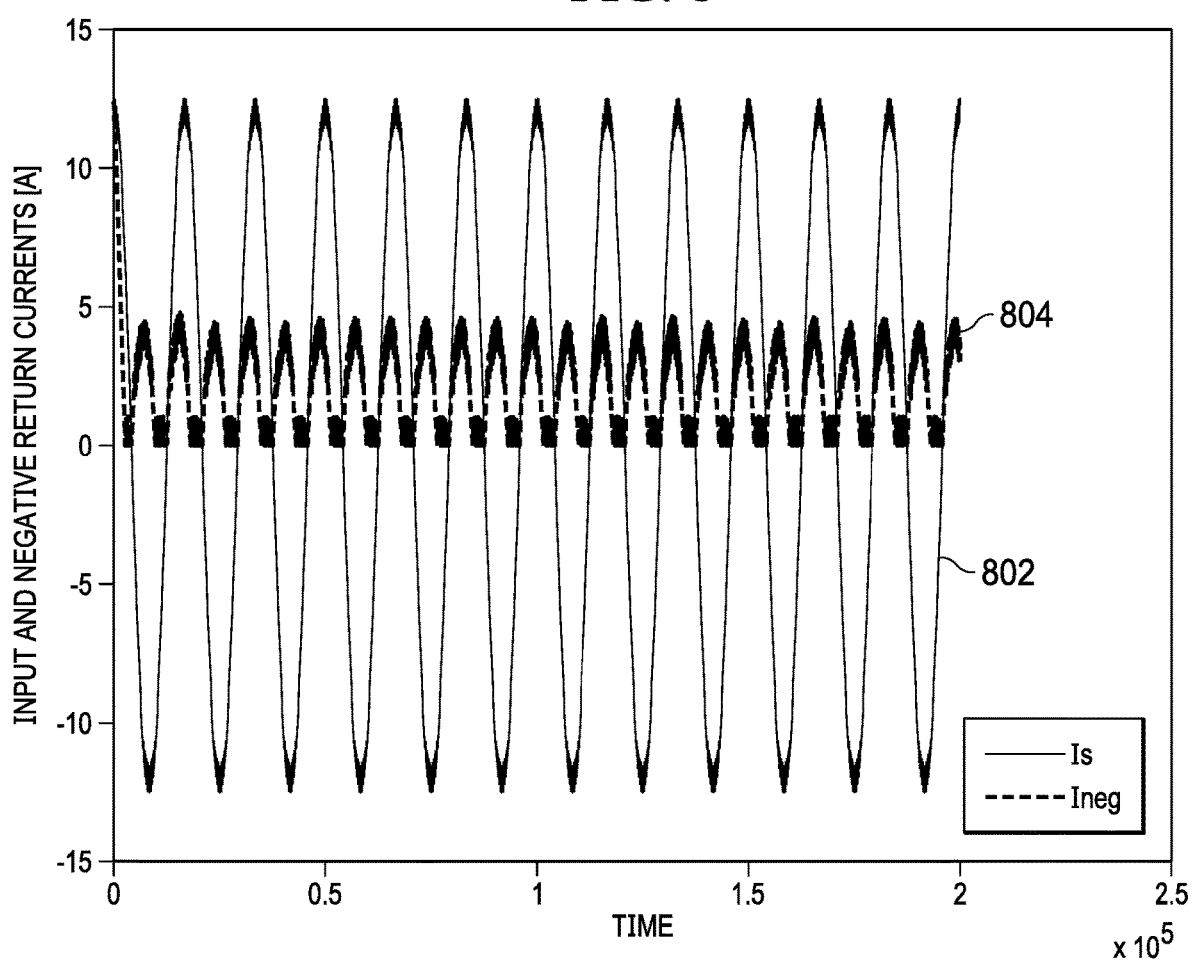

CURRENT SENSING APPARATUS IN POWER FACTOR CORRECTION CIRCUITS AND RELATED METHODS

FIELD OF THE DISCLOSURE

This disclosure relates generally to power factor correction circuits and, more particularly, to current sensing apparatus in power factor correction circuits and related methods.

BACKGROUND

The need for miniaturization is driving increased power densities of switching mode power supplies used in network, server, computing, telecom, and other industrial applications. Accordingly, high-power efficiency is an important consideration in the design of a switching mode power supply, especially for energy saving and environmental protection. In some instances, switching mode power supplies include a power factor correction circuit, which can improve the power factor of a power system but can increase power losses and reduce the overall efficiency of the switching mode power supplies.

BRIEF DESCRIPTION OF THE DRAWINGS

FIG. 8 is a graph of example current measurements associated with the example simulation circuit of FIG. 7.

DETAILED DESCRIPTION

Figure 1:
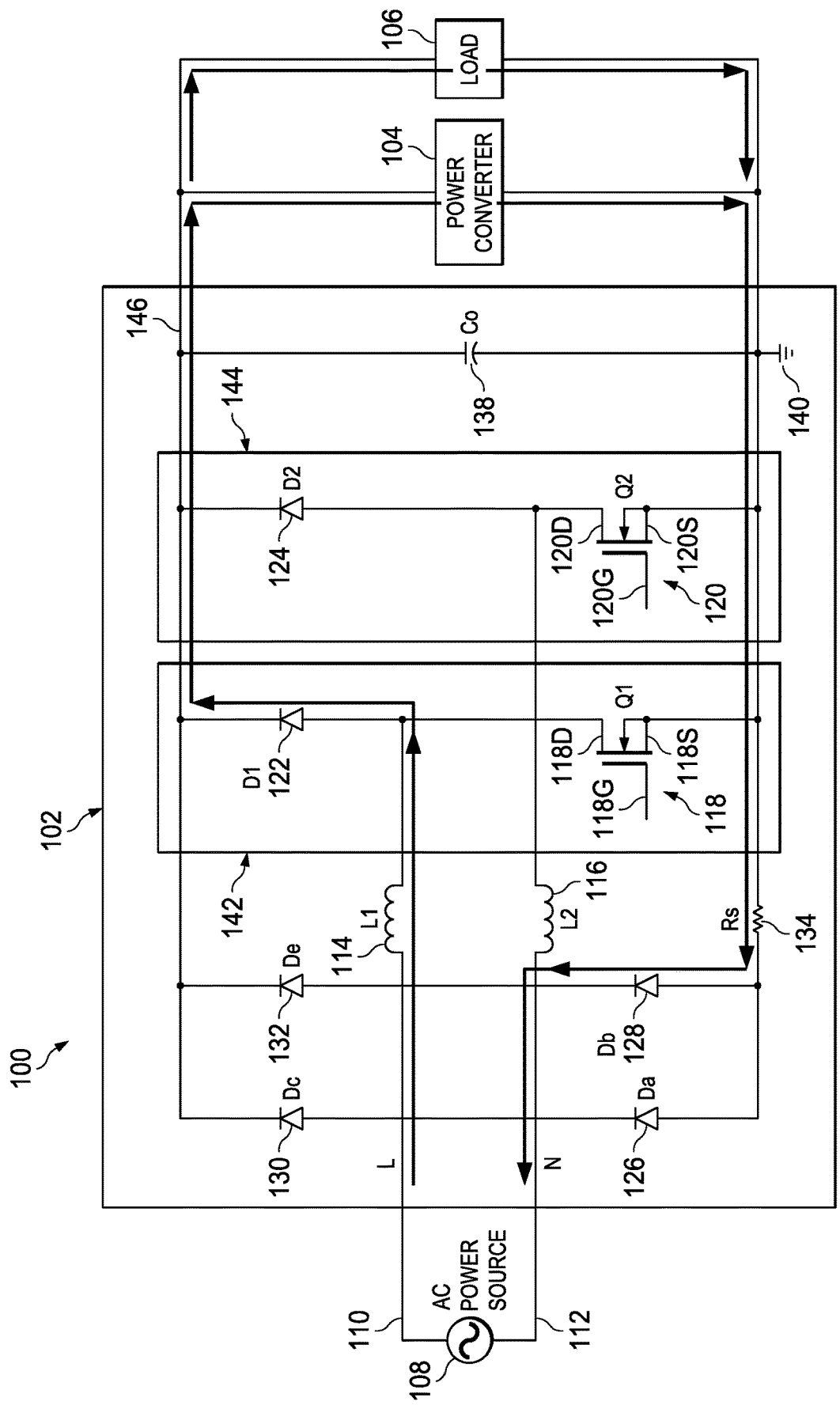
FIG. 1 is a schematic illustration of an example power conversion system including a power factor correction circuit.

The figures are not to scale. In general, the same reference numbers will be used throughout the drawing(s) and accompanying written description to refer to the same or like parts.

Descriptors "first," "second," "third," etc., are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

High-power efficiency is an important consideration in the design of a switching mode power supply, especially for energy saving and environmental protection. For instance, public and private sector regulatory initiatives have pushed for improvements in overall efficiencies of power supply systems to improve power quality. Power Factor (PF) is a measure of power quality and is the ratio between actual power used (e.g., Active Power) and delivered power (e.g., Apparent Power). Less than unity PF may be caused by nonlinear, mostly inductive loads such as motor drives, switching power supplies, solid-state lighting fixtures, etc. Poor PF may manifest itself in a phase shift between current and voltage with substantially large current spikes requiring thicker conductors, cables, etc., to deliver power to a load.

Power Factor Correction (PFC) seeks to achieve a PF close to unity for a power delivery system by reducing current spikes and reducing voltage current phase shift associated with the power delivery system. Active PFC methods may include a control circuit that measures an input voltage and current and then adjusts a switching time and duty cycle of a transistor (e.g., a power transistor) included in the control circuit to ensure that the input voltage and current are in phase. For example, the control circuit can determine that the input voltage and current are not in phase based on measurements of the input voltage and the current. In such examples, the control circuit adjusts the switching time and duty cycle of the transistor to ensure the input voltage and current to be in phase. Such active PFC methods can provide an automatic correction of the input voltage and current to improve the PF. However, such active PFC methods may not efficiently bring the input voltage and current in phase because current sensing techniques may not accurately measure an entirety of the input current and, thus, may not adjust the switching time and duty cycle of the transistor accordingly.

Some switching mode power supplies include PFC circuits such as bridge rectifier PFC circuits. Bridge rectifier PFC circuits may include four diodes arranged in a bridge circuit configuration to convert an alternating-current (AC) input into a direct-current (DC) input. However, the bridge circuit configuration can cause diode conduction loss from two of the four diodes during a half-line cycle and, thus, reduce a power efficiency of the switching mode power supply.

Some switching mode power supplies include bridgeless PFC circuits. The bridgeless PFC circuits may include two switching operating cells at each half-line cycle. Each operating cell may include a power metal-oxide semiconductor field-effect transistor (MOSFET) and a diode. In some instances, the power MOSFET is a Silicon power MOSFET. The bridgeless PFC circuits eliminate the bridge circuit configuration and, thus, eliminate the diode conduction losses associated with the bridge circuit configuration. However, in response to the bridgeless PFC circuit operating in the third quadrant (e.g., a FET is conducting from source to drain), a body diode of an inactive MOSFET conducts and effectively acts as a slow diode for the corresponding half-line cycle. The one-diode conduction loss for a bridgeless PFC circuit compared to the conduction loss from two diodes in a bridge rectifier PFC may improve efficiency by eliminating the voltage drop of one diode in the line-current path.

For a bridgeless PFC circuit, the current path does not have the same ground at each half-line cycle, which causes complications for implementing current sensing. A first current sensing method in a bridgeless PFC circuit measures current using a hall-effect sensor at the AC input. Typically, the hall-effect sensor is used in conjunction with an amplifier and a controller that requires a full-current waveform. However, adding a hall-effect sensor and related components increases cost of the switching mode power supply, increases power consumption and decreases power efficiency, and increases a size of a package (e.g., an integrated circuit package) that includes the bridgeless PFC circuit.

A second current sensing method in a bridgeless PFC circuit measures current with a current transformer. However, an addition of the current transformer to the circuit increases cost and package size. Furthermore, the addition of the current transformer significantly increases a power loop inductance of the bridgeless PFC circuit and, thereby, reduces the power efficiency of the switching mode power supply as switching losses increase with a lower change in voltage with respect to a change in time (e.g., dV/dt).

Examples disclosed herein include current sensing apparatus in PFC circuits that improve PF of active PFC circuits and improve power efficiencies of switching mode power supplies while reducing the cost and size of packages compared to many PFC circuits. In some disclosed examples, a PFC circuit includes one or more Group III-V transistors, such as one or more Gallium Nitride (GaN) field-effect transistors (FETs), that have higher voltage drops from source-to-drain (e.g., a source-to-drain voltage, VSD, etc.) compared to Silicon (Si) MOSFETs. For example, the one or more Group III-V transistors can be depletion mode GaN FETs that have a VSD in a range of 5-7 V compared to Si MOSFETS having a VSD in a range of 0.7-1.0 V. In such disclosed examples, because a GaN FET has a substantially larger VSD compared to a return diode (e.g., a Si diode, a Silicon Carbide (SiC) diode, etc.), total return current can pass through the return diode instead of through the GaN FET. In other examples, the one or more Group III-V transistors can be enhancement mode GaN FETs.

In some disclosed examples, a sense resistor is included on the return path to measure and/or otherwise sense total inductor current. For example, the sense resistor can be coupled to the return diode to measure an entirety and/or a substantial portion of the total return current passing through the return diode. Advantageously, examples disclosed herein include the sense resistor on the return path to eliminate hall-effect sensors, current transformers, etc., from PFC circuits to significantly reduce the cost and size of the PFC circuits and/or, more generally, the switching mode power supplies that include the PFC circuits. Advantageously, examples disclosed herein can measure the return current, when the one or more GaN FETs are switched off, using a sense resistor on the return current path while other PFC circuits use hall-effect sensors, current transformers, etc., to measure current.

FIG. 1 is a schematic illustration of an example power conversion system 100 including a PFC circuit 102, a power converter 104, and a load 106. In some examples, the PFC circuit 102 can be a power supply circuit. In FIG. 1, the PFC circuit 102 is an active PFC circuit that can improve the PF of the power conversion system 100 by measuring a return current when power FET is switched off and adjusting a switching time and duty cycle of one or both example transistors 118, 120 included in the PFC circuit 102 to adjust a charging rate or a discharging rate of an example capacitor (Co) 138.

In the illustrated example of FIG. 1, the power converter 104 is coupled to the PFC circuit 102 and the load 106. In FIG. 1, the power converter 104 is a DC-DC converter. For example, the power converter 104 can be a boost converter, a buck converter, a buck-boost converter, etc. Alternatively, the power conversion system 100 may include more than one of the power converter 104. For example, the power conversion system 100 can include one or more boost converters, one or more buck-boost converters, etc., and/or any combination thereof. In FIG. 1, the load 106 is coupled to the power converter 104. For example, the load 106 can correspond to an electric vehicle, one or more batteries in the electric vehicle, an electric motor in the electric vehicle, a traction inverter included in the electric vehicle, etc.

In the illustrated example of FIG. 1, the power conversion system 100 includes the PFC circuit 102 to improve the PF of the power conversion system 100. In FIG. 1, the PFC circuit 102 is coupled to and/or otherwise in circuit with the AC power source 108. In FIG. 1, the AC power source 108 has an example line (L) input 110 and an example neutral (N) input 112. The PFC circuit 102 of FIG. 1 rectifies and/or otherwise converts an AC voltage of the AC power source 108 to a DC voltage. For example, the AC voltage of the AC power source 108 can be a voltage in a range of 80 VAC to 315 VAC Root-Mean-Squared (RMS). Alternatively, the AC power source 108 may have any other AC voltage. In some examples, the DC voltage is 12 V, 24 V, etc. Alternatively, the DC voltage may be any other voltage.

In the illustrated example of FIG. 1, the PFC circuit 102 is a semi-bridgeless PFC circuit because the typical PFC inductor is split into a first example inductor (L1) 114 and a second example inductor (L2) 116. Using two inductors removes the direct application of the switching node's high dV/dt to the input terminals (e.g., the line input 110, the neutral input 112, etc.) and can make the PFC circuit 102 symmetrical and improve common mode noise immunity.

In the illustrated example of FIG. 1, the PFC circuit 102 includes the transistors 118, 120 including a first example transistor (Q1) 118 and a second example transistor (Q2) 120, a first example diode (D1) 122, and a second example diode (D2) 124. In FIG. 1, Q1 118 and Q2 120 are depletion mode GaN FETs. For example, Q1 118 and Q2 120 can be depletion mode GaN FETs that are in circuit with an integrated driver that causes the GaN FETs to behave and/or otherwise operate as a normally off switch. In FIG. 1, Q1 118 and Q2 120 can have a VDS in a range of 5-7 V when Q1 118 and Q120 are depletion mode GaN FETs. In other examples, Q1 118 and Q2 120 can have a VDS as low as approximately 0.7 V when Q1 118 and Q2 120 are Silicon FETs. Alternatively, the PFC circuit 102 may be implemented using enhancement mode GaN FETs in place of the depletion mode GaN FETs. Alternatively, Q1 118 and/or Q2 120 may have a VDS in any other range.

GaN FETs, such as Q1 118 and Q2 120 of FIG. 1, have significant advantages over Si MOSFETs. For example, GaN FETs have smaller junction capacitances, lack body diodes, and have no reverse recovery loss. In some examples, GaN FETs offer faster switching speed, smaller output charge, and lower switching losses compared to Si MOSFETs. In FIG. 1, the GaN FETs can be lateral high-electron-mobility transistors (HEMT). Without the p-n-doping drift region in the structure, GaN FETs illustrate unique characteristics in the third-quadrant operation. Third-quadrant operation occurs for a power MOSFET when the current flows from the source to the drain terminal through the body diode or the channel. Although GaN FETs have no body diode (as illustrated in FIG. 1), the symmetry of the device (e.g., the GaN FETs) helps conduct in the third quadrant with diode-like behavior.

The lateral GaN structure of Q1 118 and Q2 120 is comprised of a source (e.g., the source 118S of Q1 118, the source 120S of Q2 120, etc.) and drain (e.g., the drain 118D of Q1 118, the drain 120D of Q2 120, etc.) connected by a two-dimensional electron gas (2 DEG) channel. The gate voltage (e.g., a voltage at the gate 118G of Q1 118, a voltage at the gate 120G of Q2 120, etc.) controls the conductivity of the channel. In third-quadrant operation, the drains 118D, 120D and the sources 118S, 120S switch positions. Accordingly, the potential of the drains 118D, 120D is lower (e.g., has a lower voltage) than the potential of the gate turning on the GaN devices (e.g., Q1 118, Q2 120, etc.) and allows the reverse conduction without a body diode.

In the illustrated example of FIG. 1, Q1 118 has an example drain (e.g., a current terminal, a drain terminal, etc.) 118D, an example gate (e.g., a gate terminal) 118G, and an example source (e.g., a current terminal, a source terminal, etc.) 118S. In FIG. 1, Q2 120 has an example drain 120D, an example gate 120G, and an example source 120S.

In the illustrated example of FIG. 1, D1 122 and D2 124 are Silicon Carbide diodes. For example, D1 122 and D2 124 can each have a respective forward voltage ($V_F$) in a range of 1-1.7 V. Alternatively, one or both of D1 122 and/or D2 124 may have a forward voltage in any other range. Alternatively, one or both D1 122 and/or D2 124 may be any other type of diode (e.g., Silicon diodes).

In the illustrated example of FIG. 1, the PFC circuit 102 includes a third example diode (Da) 126, a fourth example diode (Db) 128, a fifth example diode (Dc) 130, a sixth example diode (De) 132, a first example resistor (Rs) (e.g., a sense resistor) 134, and Co 138. In FIG. 1, Da 126, Db 128, Dc 130, and De 132 are Silicon diodes. For example, Da 126, Db 128, Dc 130, and De 132 can each have a respective forward voltage in a range of 1-1.7 V. Alternatively, one or more of Da 126, Db 128, Dc 130, and/or De 132 may have a forward voltage in any other range. Alternatively, one or more of Da 126, Db 128, Dc 130, and/or De 132 may be any other type of diode (e.g., Silicon Carbide diodes).

In the illustrated example of FIG. 1, L1 114 has a first terminal (e.g., a first inductor terminal) and a second terminal (e.g., a second inductor terminal). For example, the power conversion system 100 can include a first terminal (e.g., a first inductor terminal) to be coupled to a first end of L1 114 and a second terminal (e.g., a second inductor terminal) to be coupled to a second end of L1 114. In such examples, the power conversion system 100 can be manufactured without L1 114 and L1 114 can be coupled to the power conversion system 100 using the first and second terminals. In FIG. 1, the first terminal of L1 114 is coupled to the line input 110, a cathode (e.g., a cathode terminal) of Da 126, and an anode (e.g., an anode terminal) of Dc 130. The second terminal of L1 114 is coupled to an anode of D1 122 and the drain 118D of Q1 118.

In the illustrated example of FIG. 1, L2 116 has a first terminal (e.g., a first inductor terminal) and a second terminal (e.g., a second inductor terminal). For example, the power conversion system 100 can include a first terminal (e.g., a first inductor terminal) to be coupled to a first end of L2 116 and a second terminal (e.g., a second inductor terminal) to be coupled to a second end of L2 116. In such examples, the power conversion system 100 can be manufactured without L2 116 and L2 116 can be coupled to the power conversion system 100 using the first and second terminals. In FIG. 1, the first terminal of L2 116 is coupled to the neutral input 112, a cathode of Db 128, and an anode of De 132. The second terminal of L2 116 is coupled to an anode of D2 124 and the drain 120D of Q2 120.

In the illustrated example of FIG. 1, Co 138 has a first terminal and a second terminal. In FIG. 1, the first terminal of Co 138 is coupled to a cathode of Dc 130, a cathode of De 132, a cathode of D1 122, and a cathode of D2 124. In FIG. 1, the power converter 104 is coupled to a first terminal of the load 106, the first terminal of Co 138, the cathode of Dc 130, the cathode of De 132, the cathode of D1 122, and the cathode of D2 124.

In the illustrated example of FIG. 1, the power converter 104 is coupled to a second terminal of the load 106, the second terminal of Co 138, the source 120S of Q2 120, the source 118S of Q1 118, a first terminal (e.g., a first resistor terminal, an end, a first end, etc.) of Rs 134, and an example reference rail (e.g., a ground rail, a reference voltage rail, etc.) 140. In FIG. 1, a second terminal (e.g., a second resistor terminal, an end, a second end, etc.) of Rs 134 is coupled to an anode of Da 126 and an anode of Db 128.

In the illustrated example of FIG. 1, the PFC circuit 102 is a dual-boost semi-bridgeless PFC circuit because the PFC circuit 102 includes two example operating cells 142, 144 that operate in boost-switching mode for the half-line cycle when the line input 110 is high or the half-line cycle when the neutral input 112 is high.

In the illustrated example of FIG. 1, the operating cells 142, 144 include a first example operating cell 142 and a second example operating cell 144. In FIG. 1, the first operating cell 142 is coupled to the second operating cell 144. In FIG. 1, the first operating cell 142 includes Q1 118 and D1 122. The second operating cell 144 includes Q2 120 and D2 124. For example, Q1 118 and D1 122 can operate in boost-switching mode for the half-line cycle when the line input 110 is high. In such examples, on the other half-line cycle, Q2 120 and D2 124 operate in boost-switching mode when the neutral input 112 is high.

In example operation, during the half-line cycle when the line input 110 has positive voltage with respect to the neutral input 112 (e.g., Q1 118 and/or Q2 120 are turned off and/or otherwise not enabled), current flows along an example current flow path 146 illustrated by a set of arrows in FIG. 1. The current flow path 146 of FIG. 1 corresponds to current flowing from the line input 110 to the neutral input 112 via L1 114, D1 122, the power converter 104 and/or the load 106, Rs 134, and Db 128 because Q1 118 and Q2 120 do not have body diodes. In FIG. 1, Q1 118 and Q2 120 do not conduct the current flowing along the current flow path 146 and, thus, the current flowing through Rs 134 corresponds to an entirety of the current flowing from the line input 110 to the neutral input 112. As Q1 118 and Q2 120 are GaN MOSFETs having substantially higher VSDs compared to the forward voltages of Da 126 and Db 128, Q1 118 and Q2 120 do not conduct return current flowing to the neutral input 112.

Advantageously, as total return current passes through one or more of the return diodes such as Da 126, Db 128, etc., a sense resistor such as Rs 134 can be used to measure total inductor current (e.g., current flowing through at least one of L1 114 or L2 116) associated with at least one of L1 114 or L2 116. Advantageously, by sensing and/or otherwise measuring the total inductor current via Rs 134, one or more current transformers, one or more hall-effect sensors and related components, etc., can be eliminated from conventional PFC circuits, such as dual boost semi-bridgeless PFC circuits. Advantageously, by sensing and/or otherwise measuring the total inductor current via Rs 134, the PFC circuit 102 of FIG. 1 has an improved power loop compared to conventional PFC circuits by eliminating one or more current transformers and because Rs 134 is not included in the power loop path of the PFC circuit 102 of FIG. 1. In some examples, one or more of the return diodes such as Da 126, Db 128, etc., can be replaced with a MOSFET for improved efficiency compared to conventional PFC circuits as a result of Rs 134 being included in the return current path.

Figure 2:
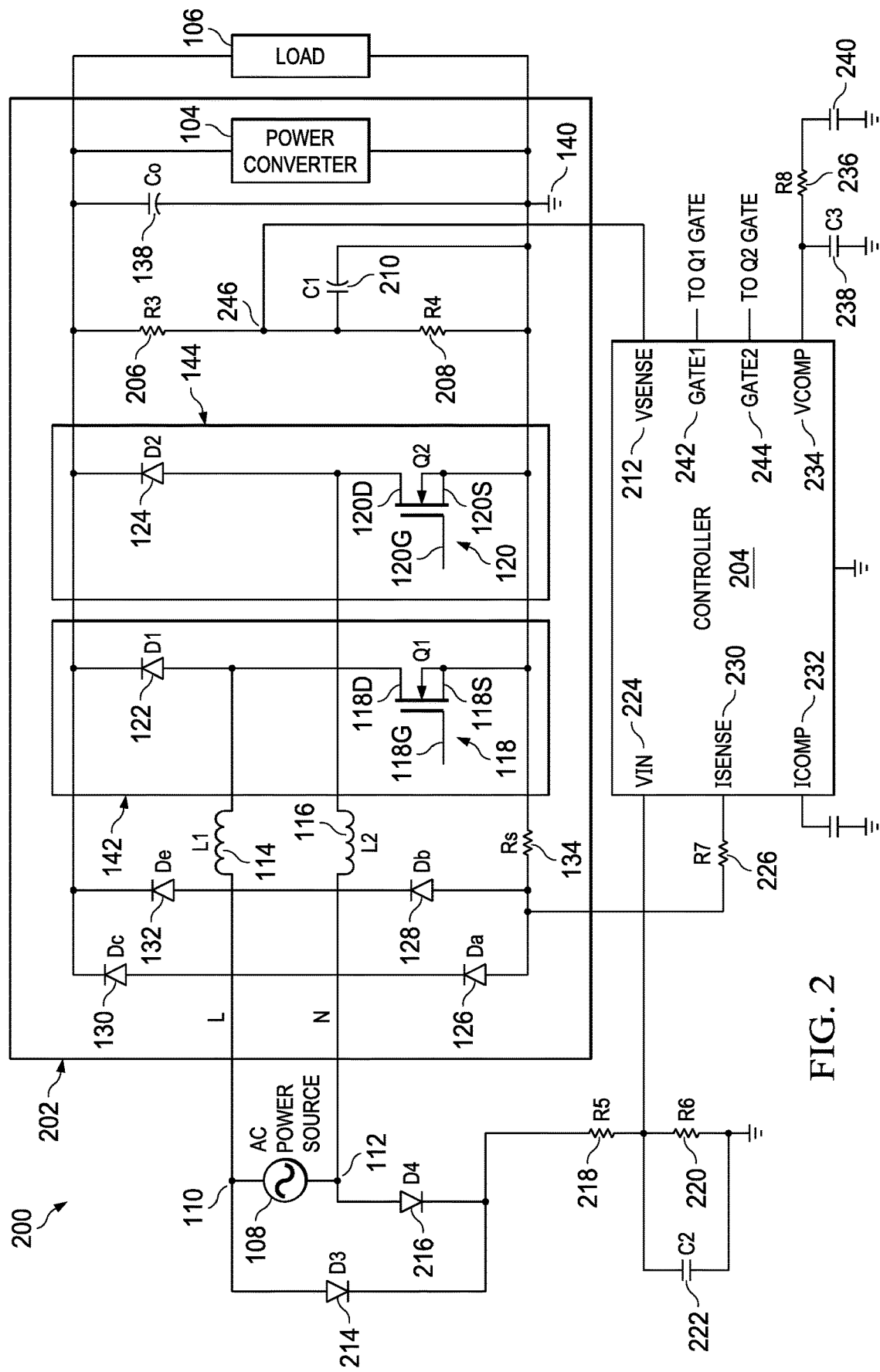
FIG. 2 is a schematic illustration of another example power conversion system including a power factor correction circuit and a controller.

FIG. 2 is a schematic illustration of another example power conversion system 200 including a second example PFC circuit 202 and an example controller 204. In FIG. 2, the controller 204 can be implemented using hardware logic, machine readable instructions, hardware implemented state machines, and/or any combination thereof. For example, the controller 204 can be implemented with hardware, software, firmware, and/or any combination thereof.

In some examples, the controller 204 can correspond to one or more microcontrollers that execute machine readable instructions. In some examples, the controller 204 can be a hardware implemented finite state machine. For example, the controller 204 can correspond to one or more microcontrollers (e.g., one or more analog microcontrollers) that include analog peripherals for sensing and/or measurement functions. The controller 204 can include one or more programmable gain amplifiers (PGAs), one or more comparators, one or more transimpedance amplifiers, one or more operational amplifiers, etc., and/or a combination thereof. In some examples, the controller 204 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)).

In the illustrated example of FIG. 2, the second PFC circuit 202 is coupled to the controller 204. In FIG. 2, the power converter 104 of FIG. 1 is coupled to the load 106 of FIG. 1 and the second PFC circuit 202. In FIG. 2, the second PFC circuit 202 includes the AC power source 108, the line input 110, the neutral input 112, L1 114, L2 116, Q1 118, Q2 120, D1 122, D2 124, Da 126, Db 128, Dc 130, De 132, Rs 134, Co 138, the reference rail 140, the first operating cell 142, and the second operating cell 144 of FIG. 1. In FIG. 2, the respective couplings of the AC power source 108, the line input 110, the neutral input 112, L1 114, L2 116, Q1 118, Q2 120, D1 122, D2 124, Da 126, Db 128, Dc 130, De 132, Rs 134, Co 138, the reference rail 140, the first operating cell 142, and the second operating cell 144 of FIG. 1 are the same as illustrated in FIG. 1.

In the illustrated example of FIG. 2, the second PFC circuit 202 includes a third example resistor (R3) 206, a fourth example resistor (R4) 208, and a second example capacitor (C1) 210. In FIG. 2, a first terminal of R3 206 is coupled to the cathode of Dc 130, the cathode of De 132, the cathode of D1 122, the cathode of D2 124, and the power converter 104. In FIG. 2, a second terminal of R3 206 is coupled to a first terminal of R4 208, a first terminal of C1 210, and a first example input (VSENSE) 212 of the controller 204. In FIG. 2, the first terminal of R4 208 is coupled to the first terminal of C1 210. In FIG. 2, a second terminal of R4 208 is coupled to a second terminal of C1 210 and the reference rail 140.

In the illustrated example of FIG. 2, an anode of a seventh example diode (D3) 214 is coupled to the line input 110. In FIG. 2, the anode of D3 214 is coupled to the cathode of Da 126, the anode of Dc 130, and the first terminal of L1 114. In FIG. 2, an anode of an eighth example diode (D4) 216 is coupled to the neutral input 112. In FIG. 2, the anode of D4 216 is coupled to the cathode of Db 128, the anode of De 132, and the first input of L2 116.

In the illustrated example of FIG. 2, a cathode of D3 214 is coupled to a cathode of D4 216 and a first terminal of a fifth example resistor (R5) 218. In FIG. 2, a second terminal of R5 218 is coupled to a first terminal of a sixth example resistor (R6) 220, a first terminal of a third example capacitor (C2) 222, and a second example input (VIN) 224 of the controller 204. In FIG. 2, a second terminal of C2 222 is coupled to a second terminal of R6 220 and the reference rail 140.

In the illustrated example of FIG. 2, the second terminal of Rs 134 is coupled to a first terminal of a seventh example resistor (R7) 226. In FIG. 2, a second terminal of R7 226 is coupled to a third example input (ISENSE) 230 of the controller 204. In FIG. 2, a fourth example input (ICOMP) 232 is coupled to the reference rail 140. In FIG. 2, the controller 204 is coupled to the reference rail 140.

In the illustrated example of FIG. 2, a fourth example input (VCOMP) 234 of the controller 204 is coupled to a first terminal of an eighth example resistor (R8) 236 and a first terminal of a fourth example capacitor (C3) 238. In FIG. 2, the controller 204 can execute voltage loop compensation with the input voltage at VCOMP 234. In FIG. 2, a second terminal of C3 238 is coupled to the reference rail 140. In FIG. 2, a second terminal of R8 236 is coupled to a first terminal of a fifth example capacitor (C4) 240. In FIG. a second terminal of C4 240 is coupled to the reference rail 140.

In the illustrated example of FIG. 2, the controller 204 is coupled to Q1 118 and Q2 120 of FIG. 1. In FIG. 2, a first example output (GATE1) 242 of the controller 204 is coupled to the gate 118G of Q1 118. For example, the controller 204 can turn on or off Q1 118 by adjusting a gate voltage of the gate 118G of Q1 118 via the first output 242. In FIG. 2, a second example output (GATE2) 244 of the controller 204 is coupled to the gate 120G of Q2 120. For example, the controller 204 can turn on or off Q2 120 by adjusting a gate voltage of the gate 120G of Q2 120 via the second output 244. In some examples, in response to the controller 204 turning on Q1 118 and/or Q2 120, the current flowing through Rs 134 is a first current having a first value. In some examples, in response to the controller 204 turning off Q1 118 and/or Q2 120, the current flowing through Rs 134 is a second current having a second value, where the second current (e.g., the second value) is greater than the first current (e.g., the first value).

In example operation, the controller 204 can sense and/or otherwise measure a voltage at an example node 246 via VSENSE 212. The voltage at the node 246 can correspond to an output voltage associated with the load 106. In example operation, the controller 204 can determine the voltage at the node 246 by comparing the voltage to a reference voltage or a pre-defined voltage determined by the controller 204.

In example operation, in response to determining the voltage at the node 246, the controller 204 can turn off Q1 118 via GATE1 242 and/or Q2 120 via GATE2 244. In example operation, the controller 204 can obtain the voltage of the AC power source 108 at VIN 224 via the circuit (e.g., D3 214, D4 216, R5 218, R6 220, C2 222) coupled to VIN 224. For example, the controller 204 can sample the voltage of the AC power source 108 at VIN 224. The controller 204 can determine an input current reference based on the sampled AC power source voltage. The controller 204 can determine the input current reference to be in phase with VIN. The controller 204 can compare the current measured at ISENSE 230 to the input current reference and control Q1 118 and/or Q2 120 via GATE1 242 and/or GATE2 244, respectively, based on the comparison. For example, the controller 204 can determine that input voltage and the input current are not in phase based on the comparison of the total return current (e.g., the current measured at ISENSE 230) and the input current reference (e.g., determined at VIN 224). In such examples, the controller 204 can determine the total return current when Q1 118 and/or Q2 120 are switched off.

In some examples, the controller 204 improve the PF of the power conversion system 200 by re-shaping the input current associated with the AC power source 108, and/or, more generally, the input current of the power conversion system 200. For example, the controller 204 can determine that the input current and the input voltage of the power conversion system 100 are out of phase based on a measurement of the total return current via Rs 134. In such examples, in response to determining that the input current and the input voltage are out of phase, the controller 204 can adjust a charging rate of Co 138, a discharging rate of Co 138, etc., by changing a switching cycle and duty cycle of Q1 118 and/or Q2 120. Advantageously, by measuring the total return current via Rs 134, the controller 204 can improve power factor, or in some examples, achieve unity power factor, by adjusting operation (e.g., adjusting a switching cycle, adjusting a duty cycle, etc.) of Q1 118 and Q2 120 based on the total return current instead of a portion of the total return current as seen in other PFC circuits. Advantageously, based on the total return current, the controller 204 can improve operation of the PFC circuit 102 and/or, more generally, the power conversion system 200 of FIG. 2 based on the measured current flowing through Rs 134.

Figure 3:
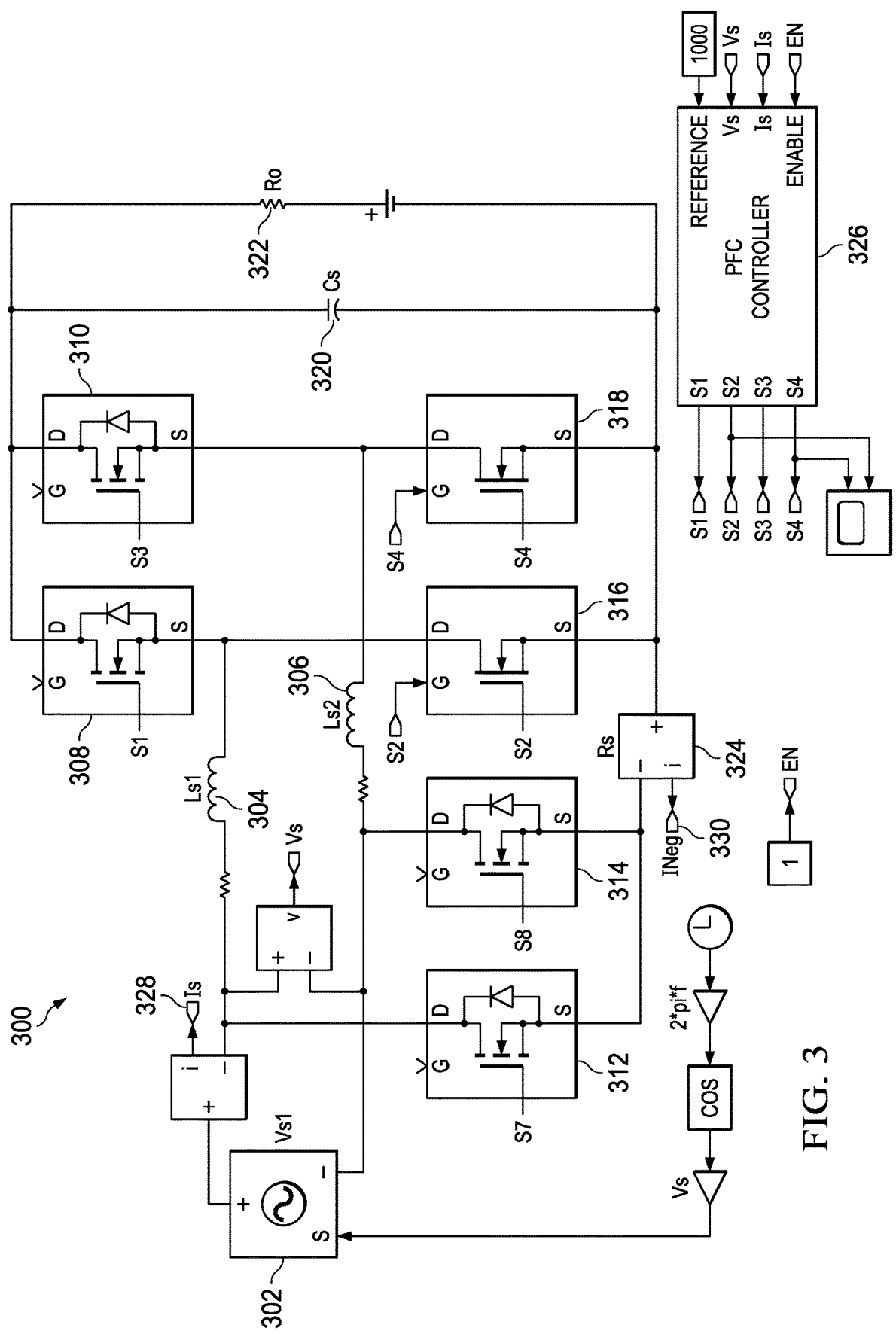
FIG. 3 is a schematic illustration of an example simulation circuit to measure a current associated with the example power conversion system of FIGS. 1 and/or 2.

FIG. 3 is a schematic illustration of an example simulation circuit 300 to measure a current associated with the power conversion system 100 of FIG. 1 and/or the power conversion system 200 of FIG. 2. For example, the simulation circuit 300 can be representative of a computer-based model that, when executed by hardware such as one or more processors, can simulate operation of the simulation circuit 300. In such examples, the simulation circuit 300 can correspond to a computer-based model, a simulation, etc., of the power conversion system 100 of FIG. 1, the power conversion system 200 of FIG. 2, etc.

In the illustrated example of FIG. 3, Vs1 302 is representative of and/or otherwise corresponding to the AC power source 108 of FIGS. 1-2. In FIG. 3, Ls1 304 is representative of L1 114 of FIGS. 1-2. In FIG. 3, Ls2 306 is representative of L2 116 of FIGS. 1-2. In FIG. 3, S1 308 is representative of D1 122 of FIGS. 1-2. In FIG. 3, S3 310 is representative of D2 124 of FIGS. 1-2. In FIG. 3, S7 312 is representative of Da 126 of FIGS. 1-2. In FIG. 3, S8 314 is representative of Db 128 of FIGS. 1-2. For example, D1 122, D2 124, Da 126, and Db 128 can be simulated using a normally off MOSFET (e.g., a SiC N-channel MOSFET, a Si N-channel MOSFET, etc.).

In the illustrated example of FIG. 3, S2 316 is representative of Q1 118 of FIGS. 1-2. In FIG. 3, S4 318 is representative of Q2 120 of FIGS. 1-2. In FIG. 3, Cs 320 is representative of Co 138 of FIGS. 1-2. In FIG. 3, Ro 322 is representative of the power converter 104 and/or the load 106 of FIGS. 1-2. In FIG. 3, Rs 324 is representative of Rs 134 of FIGS. 1-2. In FIG. 3, PFC controller 326 is representative of the controller 204 of FIG. 2.

In response to simulating and/or otherwise executing the simulation circuit 300 of FIG. 3, the PFC controller 326 measures example signals such as Is 328 and INeg 330. In FIG. 3, Is 328 is representative of an input current to the simulation circuit 300 that is generated by Vs1 302. In FIG. 3, INeg 330 is representative of a return current (e.g., a negative return current) flowing through at least one of S7 312 or S8 314.

Figure 4:
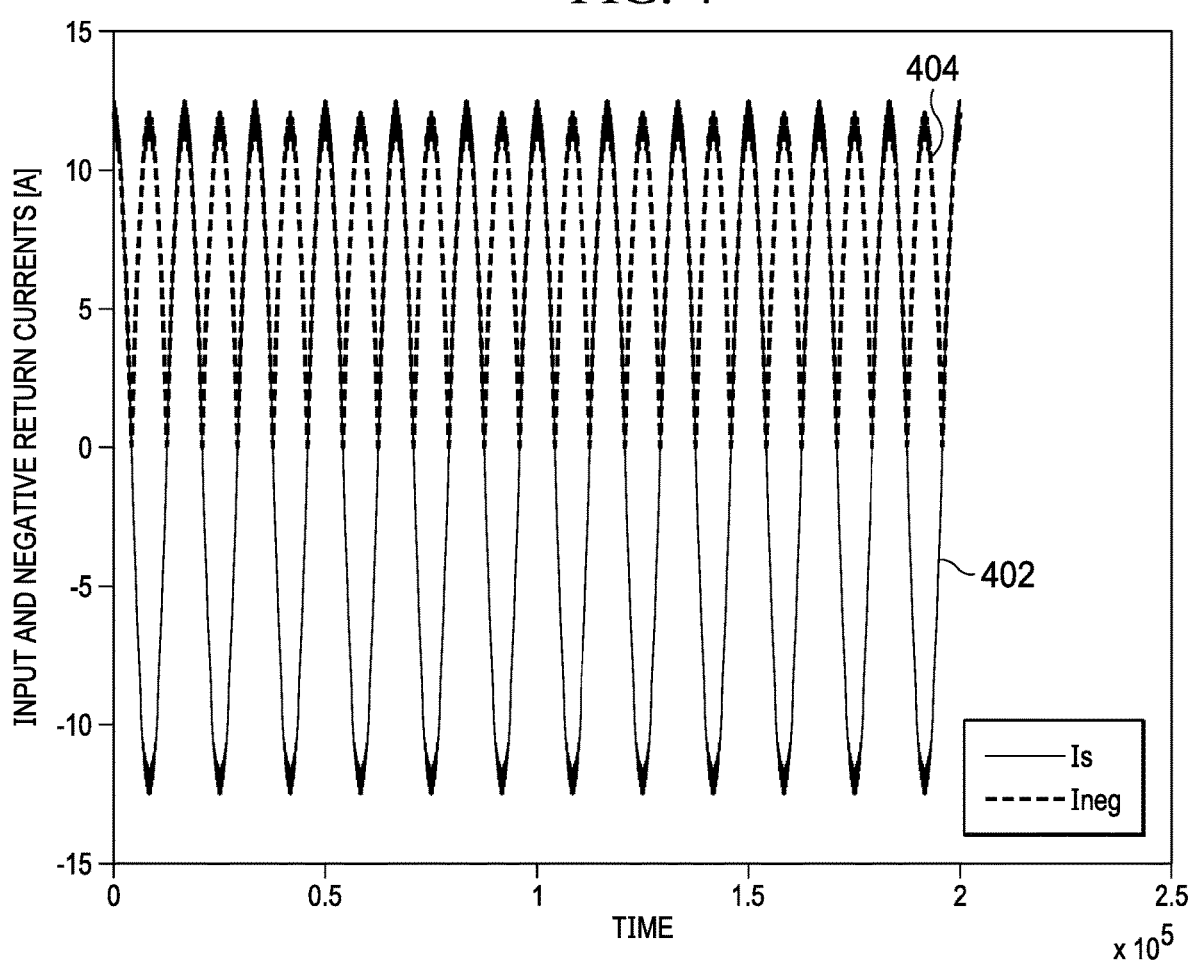
FIG. 4 is a graph of example current measurements associated with the example simulation circuit of FIG. 3.

FIG. 4 is a graph 400 of example current measurements 402, 404 associated with the simulation circuit 300 of FIG. 3. For example, the current measurements 402, 404 can correspond to measurements of electric currents generated in response to executing the simulation circuit 300 of FIG. 3.

In the illustrated example of FIG. 4, the current measurements 402, 404 include a first example waveform 402 and a second example waveform 404. In FIG. 4, the first waveform 402 corresponds to Is 328 of FIG. 3. In FIG. 4, the second waveform 404 corresponds to INeg 330 of FIG. 3. Advantageously, because Q1 118 and Q2 120 of FIGS. 1-2 are GaN FETs that have a substantially higher VSD compared to the forward voltages of Da 126, Db 128, etc., of FIGS. 1-2, Da 126 and/or Db 128 conduct a substantial portion of the input current and/or otherwise the entirety or total of the input current as depicted in FIG. 4.

Figure 5:
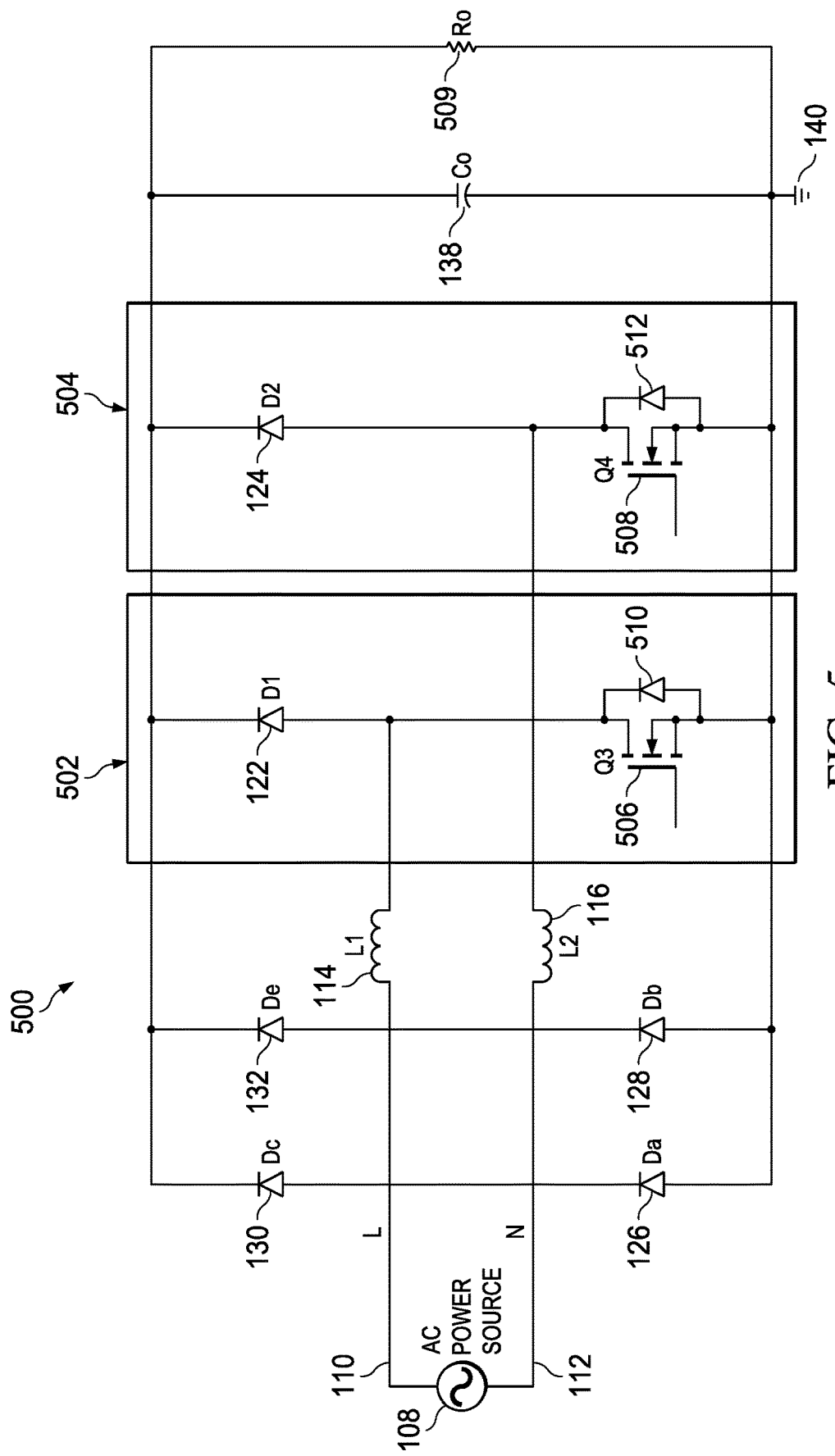
FIG. 5 is a schematic illustration of an example power factor correction circuit.

FIG. 5 is a schematic illustration of an example PFC circuit 500. In FIG. 5, the PFC circuit 500 is a dual-boost semi-bridgeless PFC circuit. In FIG. 5, the PFC circuit 500 includes the AC power source 108, the line input 110, the neutral input 112, L1 114, L2 116, D1 122, D2 124, Da 126, Db 128, Dc 130, De 132, Co 138, and the reference rail 140 of FIGS. 1-2.

In the illustrated example of FIG. 5, the PFC circuit 500 includes two example operating cells 502, 504 that operate in boost-switching mode for the half-line cycle when the line input 110 is high or the half-line cycle when the neutral input 112 is high. The operating cells 502, 504 of FIG. 5 include a third example operating cell 502 and a fourth example operating cell 506. In FIG. 5, the third operating cell 502 is coupled to the fourth operating cell 504. In FIG. 5, the third operating cell 502 includes a third example transistor (Q3) 506 and D1 122. The fourth operating cell 504 includes a fourth example transistor (Q4) 508 and D2 124. For example, Q3 506 and D1 122 can operate in boost-switching mode for the half-line cycle when the line input 110 is high. In such examples, on the other half-line cycle, Q4 508 and D2 124 operate in boost-switching mode when the neutral input 112 is high. In FIG. 5, the PFC circuit 500 includes an example load (Ro) 509 representative of one or more loads. For example, Ro 509 can correspond to at least one of the power converter 104 or the load 106 of FIGS. 1-2.

In the illustrated example of FIG. 5, Q3 506 and Q4 508 are Silicon N-channel MOSFETs. For example, Q3 506 and Q4 508 can have a VDS in a range of 1-1.7 V. In such examples, the VDS of Q3 506 can be represented by a first example body diode 510 and the VDS of Q4 508 can be represented by a second example body diode 512.

Figure 6:
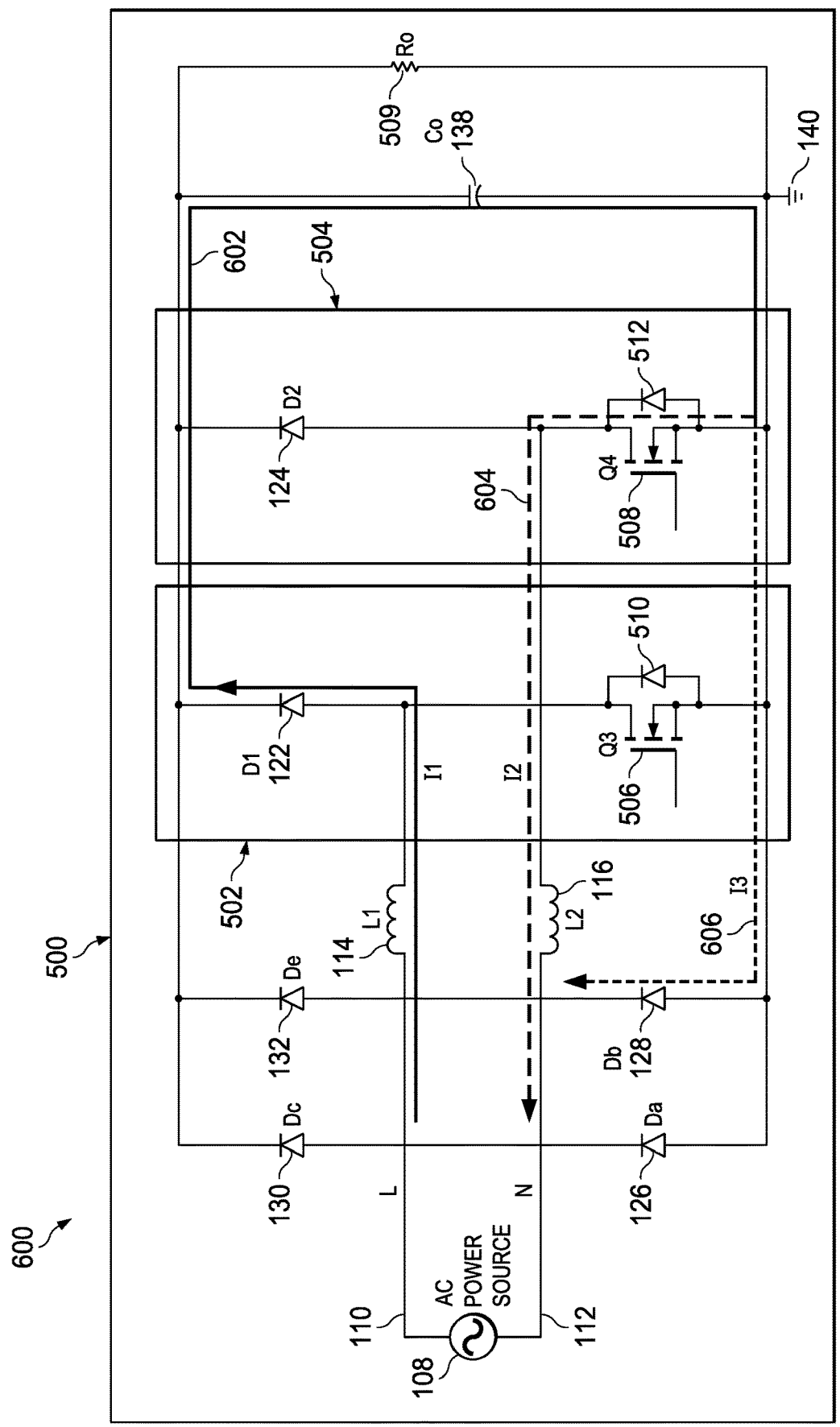
FIG. 6 is a schematic illustration of an example current flow diagram depicting flows of example currents in the example power factor correction circuit of FIG. 5.

FIG. 6 is a schematic illustration of an example current flow diagram 600 depicting flows of example currents 602, 604, 606 in the PFC circuit 500 of FIG. 5. For example, the currents 602, 604, 606 can be generated in response to operating, enabling, etc., the PFC circuit 500 of FIG. 5. In FIG. 6, the currents 602, 604, 606 include a first example current (I1) 602, a second example current (I2) 604, and a third example current (I3) 606.

In example operation, during the half-line cycle when the line input 110 is high (e.g., Q3 506 and/or Q4 508 are turned off and/or otherwise not enabled), current flows from the line input 110 to the neutral input 112 via two different current paths. For example, I1 602 can be divided and/or otherwise split into I2 604 and I3 606. In such examples, current can flow along a first current flow path that corresponds to current flowing from the line input 110 to the neutral input 112 via L1 114, D1 122, Co 138, and the second body diode 512 of Q4 508. In FIG. 6, current can flow along a second current flow path that corresponds to current flowing from the line input 110 to the neutral input 112 via L1 114, D1 122, Co 138, and Db 128.

In the illustrated example of FIG. 6, the second body diode 512 of Q4 508 conducts a first portion of I1 602 because the VDS of Q4 508 is substantially similar to the forward voltage of Da 126 and/or Db 128. Accordingly, Db 128 may only conduct a second portion of I1 602, where the second portion of I1 602 can be different from the first portion of I1 602. Because Q4 508 conducts the first portion of I1 602, placing a sense resistor such as Rs 134 of FIGS. 1-2 along the return current path may only measure the second portion of I1 602. Advantageously, the PFC circuit 102 of FIG. 1 and/or the second PFC circuit 202 of FIG. 2 can measure an entirety of the total return current (e.g., I1 602) via Rs 134, whereas the PFC circuit 500 of FIGS. 5-6 can measure only a portion (e.g., the second portion) of the total return current.

In the illustrated example of FIG. 6, the first portion of the total return current is conducted through the second body diode 512 and, thus, a sense resistor such as Rs 134 of FIGS. 1-2 cannot be used to measure total inductor current (e.g., current flowing through at least one of L1 114 or L2 116) associated with at least one of L1 114 or L2 116. As the PFC circuit 500 of FIGS. 5-6 cannot sense and/or otherwise measure the total inductor current via a sense resistor such as Rs 134, one or more current transformers, one or more hall-effect sensors and related components, etc., may be needed compared to the PFC circuit 102 of FIG. 1, the second PFC circuit 202 of FIG. 2, etc.

Figure 7:
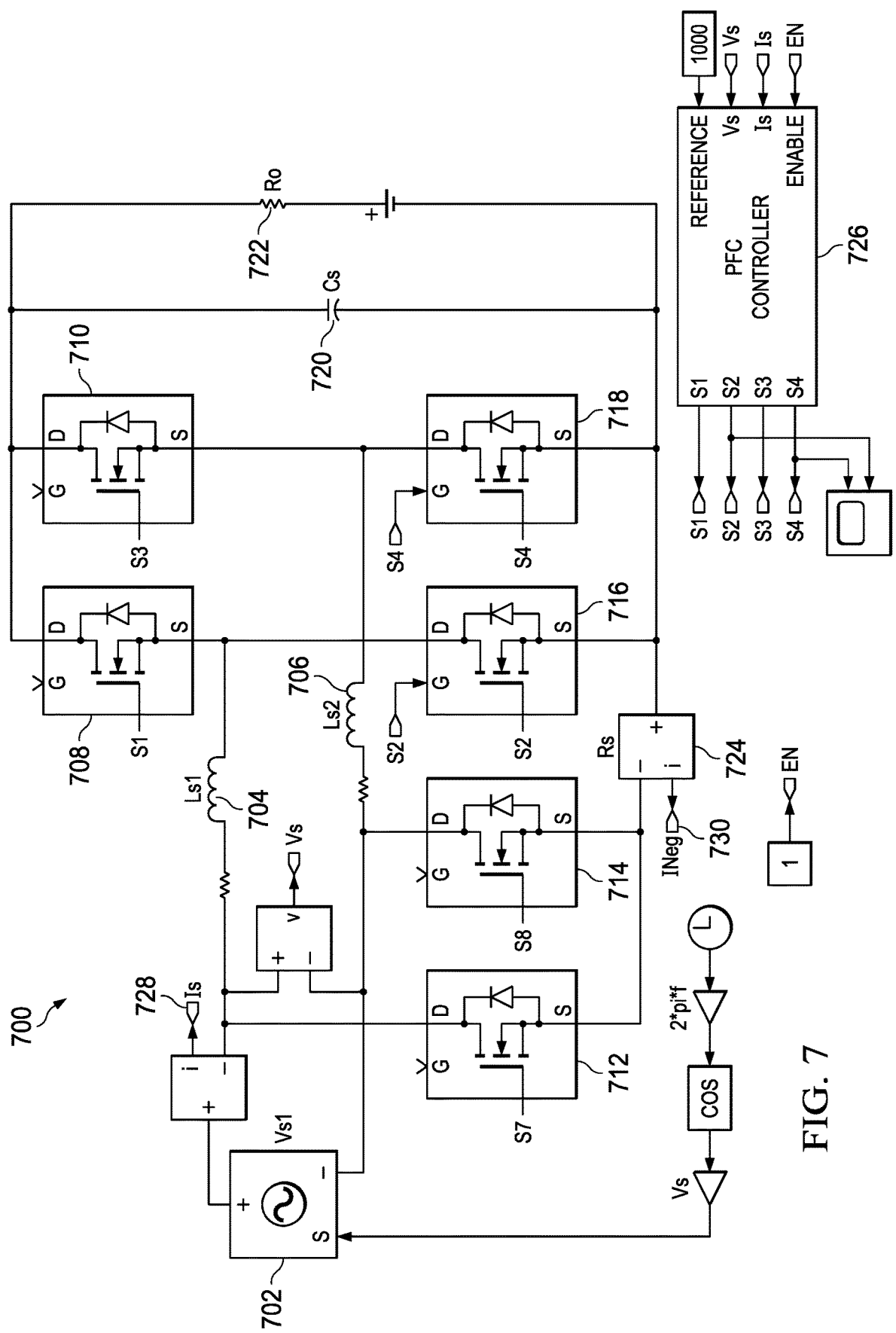
FIG. 7 is a schematic illustration of an example simulation circuit to measure a current associated with the example power factor correction circuit of FIG. 5.

FIG. 7 is a schematic illustration of an example simulation circuit 700 to measure a current associated with the PFC circuit 500 of FIGS. 5-6. For example, the simulation circuit 700 can be representative of a computer-based model that, when executed by hardware such as one or more processors, can simulate operation of the simulation circuit 700. In such examples, the simulation circuit 700 can correspond to a computer-based model, a simulation, etc., of the PFC circuit 500 of FIGS. 5-6.

In the illustrated example of FIG. 7, Vs1 702 is representative of and/or otherwise corresponding to the AC power source 108 of FIGS. 1-2 and 5-6. In FIG. 7, Ls1 704 is representative of L1 114 of FIGS. 1-2 and 5-6. In FIG. 7, Ls2 706 is representative of L2 116 of FIGS. 1-2 and 5-6. In FIG. 7, S1 708 is representative of D1 122 of FIGS. 1-2 and 5-6. In FIG. 7, S3 710 is representative of D2 124 of FIGS. 1-2 and 5-6. In FIG. 7, S7 712 is representative of Da 126 of FIGS. 1-2 and 5-6. In FIG. 7, S8 714 is representative of Db 128 of FIGS. 1-2 and 5-6. For example, D1 122, D2 124, Da 126, and Db 128 can be simulated using an N-channel MOSFET (e.g., a SiC N-channel MOSFET, a Si N-channel MOSFET, etc.).

In the illustrated example of FIG. 7, S2 716 is representative of Q3 506 of FIGS. 5-6. In FIG. 7, S4 718 is representative of Q4 508 of FIGS. 5-6. In FIG. 7, Cs 720 is representative of Co 138 of FIGS. 1-2 and 5-6. In FIG. 7, Ro 722 is representative of the power converter 104 and/or the load 106 of FIGS. 1-2 and 5-6. In FIG. 7, Rs 724 is representative of a sense resistor such as Rs 134 of FIGS. 1-2 placed, installed, etc., along the current return path of FIGS. 5-6. For example, Rs 724 can be coupled to the anode of Db 128, a source terminal of Q3 506, and a source terminal of Q4 508. In FIG. 7, PFC controller 726 is representative of the controller 204 of FIG. 2.

In response to simulating and/or otherwise executing the simulation circuit 700 of FIG. 7, the PFC controller 726 measures example signals such as Is 728 and INeg 730. In FIG. 7, Is 728 is representative of an input current to the simulation circuit 700 that is generated by Vs1 702. In FIG. 7, INeg 730 is representative of a return current (e.g., a negative return current) flowing through at least one of S7 712 or S8 714.

FIG. 8 is a graph 800 of example current measurements 802, 804 associated with the simulation circuit 700 of FIG. 7. For example, the current measurements 802, 804 can correspond to measurements of electric currents generated in response to executing the simulation circuit 700 of FIG. 7.

In the illustrated example of FIG. 8, the current measurements 802, 804 include a third example waveform 802 and a fourth example waveform 804. In FIG. 8, the third waveform 802 corresponds to Is 728 of FIG. 7. In FIG. 8, the fourth waveform 804 corresponds to INeg 730 of FIG. 7. Because Q3 506 and Q4 508 of FIGS. 5-6 are Si MOSFETs that have a VSD that is substantially similar to the forward voltages of Da 126, Db 128, etc., of FIGS. 1-2 and 5-6, the second body diode 512 of FIGS. 5-6 conducts a first portion of Is 728, which causes Rs 724 of FIG. 7 to sense only a second portion of Is 728, where the second portion is different from the first. Advantageously, the PFC circuit 102 of FIG. 1 and/or the second PFC circuit 202 of FIG. 2 enables measurement of an entirety of Is 328 of FIG. 3 as depicted in FIG. 4 compared to only the second portion of Is 728 of FIG. 7 as depicted in FIG. 7. Accordingly, the PFC circuit 500 of FIGS. 5-6 cannot use a sense resistor such as Rs 134 of FIGS. 1-2 in the current return path for current sensing or measurement because only the second portion of Is 728 may be measured.

Figure 9A:
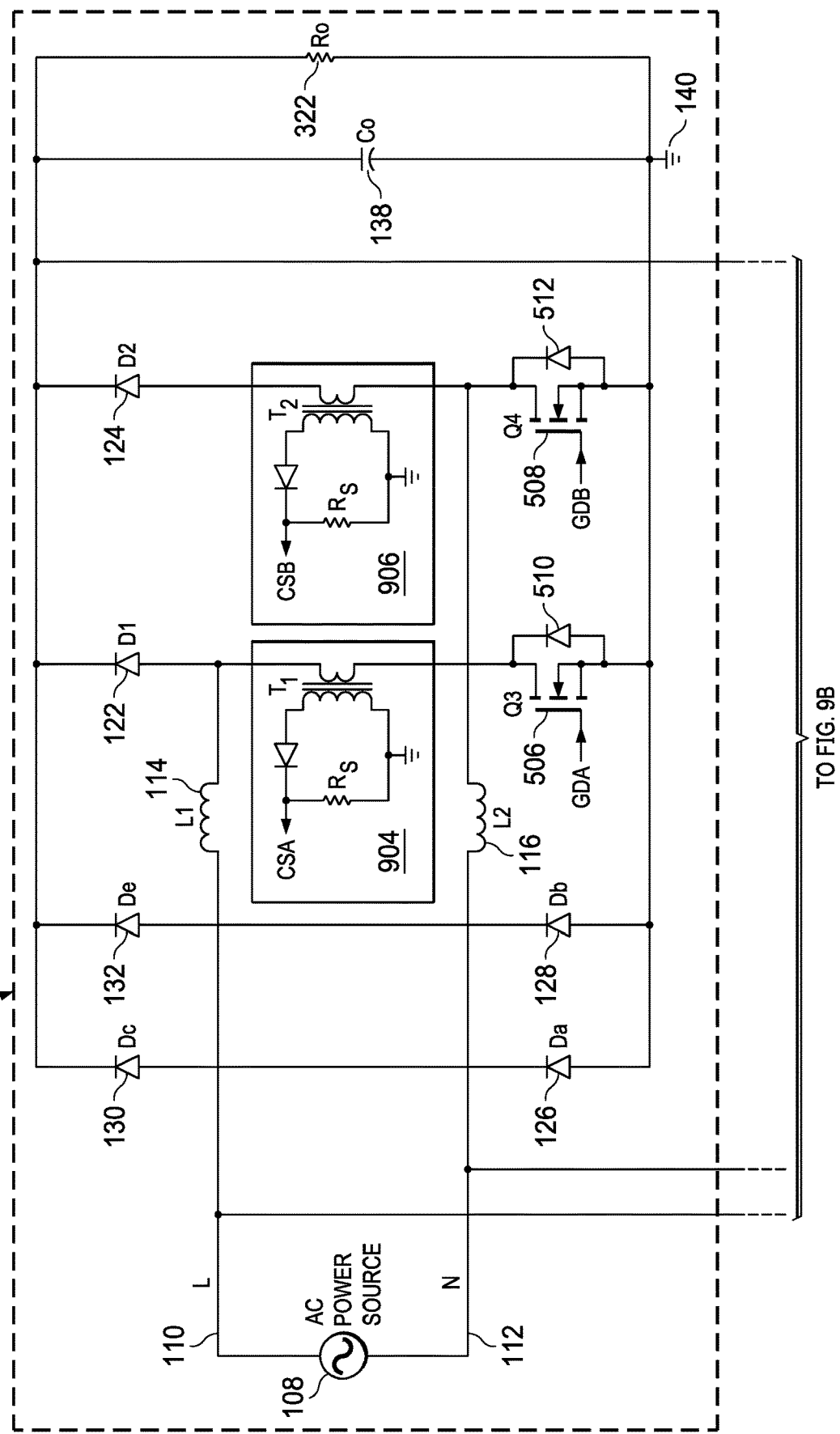
FIGS. 9A-9B depict schematic illustrations of another example power factor correction circuit.
Figure 9B:
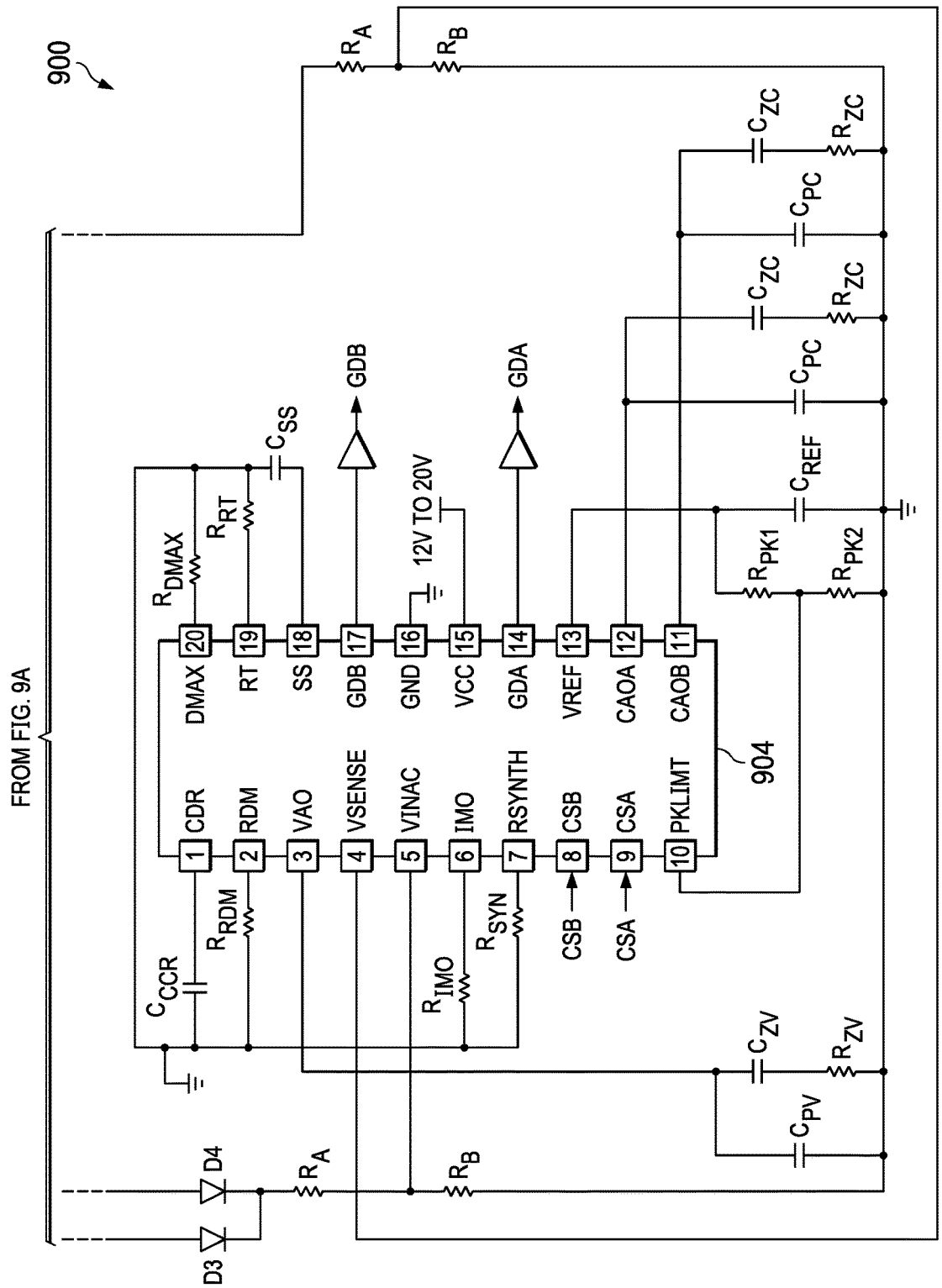

FIGS. 9A-9B depict a schematic illustration of an example PFC system 900 including an example PFC circuit 902 and an example controller 904. For example, the controller 904 of FIG. 9B can correspond to the controller 204 of FIG. 2. In FIGS. 9A-9B, the PFC circuit 902 is coupled to the controller 904. The PFC circuit 902 is an example implementation of the PFC circuit 500 of FIGS. 5-6. In FIG. 9A, the PFC circuit 902 is a dual-boost semi-bridgeless PFC circuit. In FIG. 9A, the PFC circuit 902 includes the AC power source 108, the line input 110, the neutral input 112, L1 114, L2 116, D1 122, D2 124, Da 126, Db 128, Dc 130, De 132, Co 138, and the reference rail 140 of FIGS. 1-2 and 5-6, Ro 322 of FIG. 3, and Q3 506, Q4 508, the first body diode 510, and the second body diode 512 of FIGS. 5-6.

In the illustrated example of FIGS. 9A-9B, the PFC circuit 902 is coupled to the controller 904. In FIGS. 9A-9B, the controller 904 determines a first current flowing through L1 114 via a first example current sensor 906. In FIGS. 9A-9B, the controller 904 determines a second current flowing through L2 116 via a second example current sensor 908. In FIG. 9A, the first current sensor 906 and the second current sensor 908 are current transformer circuits that include a transformer, a resistor, and a diode. For example, the controller 904 can measure a first current associated with a first current (e.g., a first input current) flowing through L1 114 by measuring the first current at a first input (CSA) of the controller 904. In such examples, the controller 904 can measure a second current associated with a second current (e.g., a second input current) flowing through L2 116 by measuring the second current at a second input (CSB) of the controller 904.

In the illustrated example of FIG. 9A, because the inductor terminals of L1 114 and L2 116 are floating with respect to the reference rail 140 and the current is not shared equally between L1 114 and L2 116, a sense resistor such as Rs 134 of FIGS. 1-2 cannot be used to measure the input current flowing through at least one of L1 114 or L2 116. Advantageously, the PFC circuit 102 of FIG. 1 and/or the second PFC circuit 202 of FIG. 2 is an improvement to the PFC circuit 902 of FIG. 9A because the current sensors 906, 908 of FIG. 9A are substantially larger in size, substantially more expensive in cost, etc., compared to Rs 134 of FIGS. 1-2.

Figure 10:
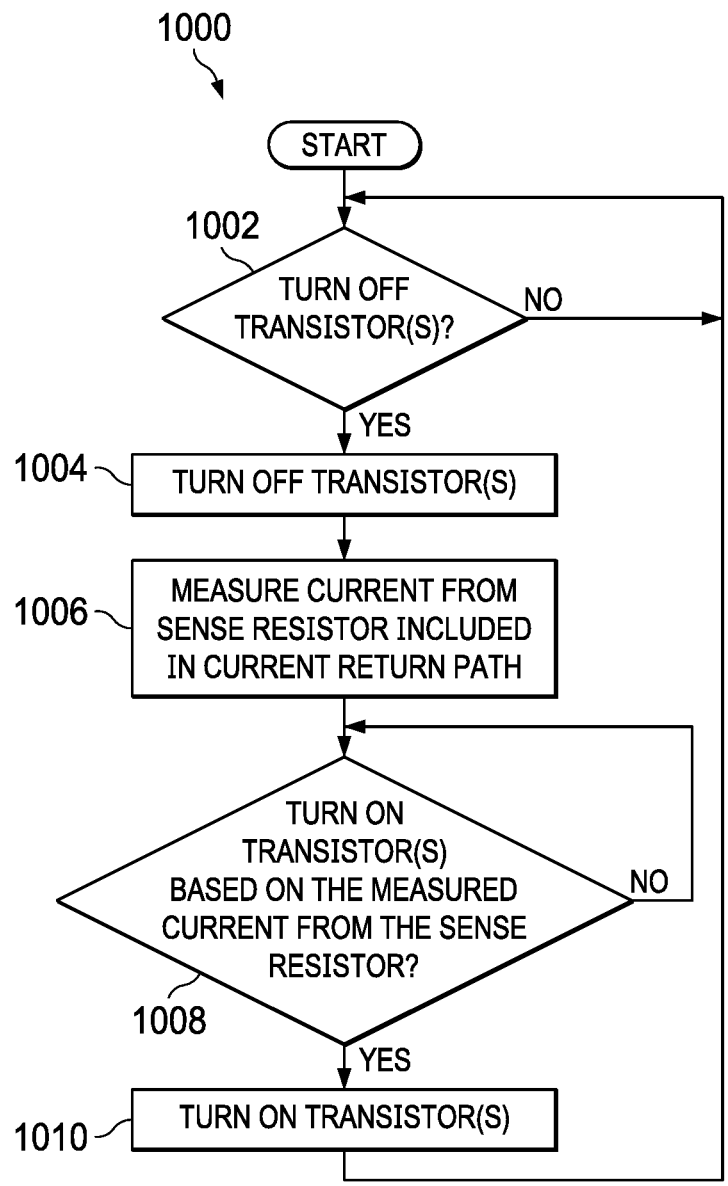
FIG. 10 is a flowchart representative of a process that may be carried out while utilizing example machine readable instructions that may be executed and/or hardware configured to implement the example power conversion system of FIG. 1.

A flowchart representative of example hardware logic, machine readable instructions, hardware implemented state machines, and/or any combination thereof for implementing the controller 204 of FIG. 2, and/or the power conversion system 100 of FIG. 1 is shown in FIG. 10. The machine readable instructions may be one or more executable programs or portion(s) of an executable program for execution by one or more analog or digital circuit(s), logic circuits, programmable processor(s), programmable controller(s), GPU(s), DSP(s), ASIC(s), PLD(s), and/or FPLD(s). The program may be embodied in software stored on a non-transitory computer readable storage medium such as non-volatile memory, (e.g., read-only memory (ROM), electrically erasable programmable read-only memory (EEPROM), flash memory, etc.), volatile memory (e.g., Synchronous Dynamic Random Access Memory (SDRAM), Dynamic Random Access Memory (DRAM), etc., and/or any other type of random access memory (RAM) device), etc. Further, although the example program is described with reference to the flowchart illustrated in FIG. 10, many other methods of implementing the example controller 204 and/or the power conversion system 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by one or more processors of a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIG. 10 may be implemented using executable instructions (e.g., computer and/or machine readable instructions) stored on a non-transitory computer and/or machine readable medium such as non-volatile memory, volatile memory, etc., and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 10 is a flowchart representative of an example process 1000 that may be carried out while utilizing machine readable instructions that may be executed (e.g., executed by the controller 204 of FIG. 2) and/or hardware configured to implement the power conversion system 100 of FIG. 1. The process 1000 of FIG. 10 begins at block 1002, at which the controller 204 determines whether to turn off transistor(s). For example, the controller 204 can determine to turn off Q1 118 and/or Q2 120 of FIGS. 1-2 based on voltage(s) determined at VSENSE 212, VIN 224, etc., of FIG. 2.

If, at block 1002, the controller 204 determines not to turn off the transistor(s), control waits at block 1002. If, at block 1002, the controller 204 determines to turn off the transistor(s), then, at block 1004, the controller 204 turns off the transistor(s). For example, the controller 204 can turn off Q1 118 by adjusting a gate voltage of the gate 118G of Q1 118 via GATE1 242 of FIG. 2.

At block 1006, the controller 204 measures a current from a sense resistor included in a current return path. For example, the controller 204 can measure the return current flowing through Rs 134 of FIGS. 1-2 via ISENSE 230 of FIG. 2. In such examples, the controller 204 can determine that the input voltage and the input current of the AC power source 108 of FIGS. 1-2 are out of phase based on comparing the return current and an input current reference determined by VIN 224 of FIG. 2. Advantageously, the controller 204 can sense, measure, and/or otherwise determine an entirety of the return current via Rs 134 compared to other bulky (e.g., substantially large) and costly (e.g., substantially fiscally or monetarily expensive) current sensing approaches such as current transformers, Hall-effect sensors, etc.

At block 1008, the controller 204 determines whether to turn on transistor(s) based on the measured current from the sense resistor. For example, the controller 204 can determine to (1) turn on Q1 118 via GATE1 242, (2) turn on Q2 120 via GATE2 242 of FIG. 2, etc., and/or a combination thereof based on the return current associated with Rs 134. In such examples, the controller 204 can determine to turn on Q1 118 and/or Q2 120 to reduce a charging rate of Co 138 of FIGS. 1-2 to enable the input current and the input voltage of the AC power source 108 to converge to the same phase and, thus, improve the PF of the power conversion system 100 of FIG. 1, the power conversion system 200 of FIG. 2, etc. In other examples, the controller 204 can determine to (1) turn off Q1 118 via GATE1 242, (2) turn off Q2 120 via GATE2 242 of FIG. 2, etc., and/or a combination thereof based on the return current associated with Rs 134. In such examples, the controller 204 can determine to turn off Q1 118 and/or Q2 120 to increase a charging rate of Co 138 of FIGS. 1-2 to enable the input current and the input voltage of the AC power source 108 to converge to the same phase and, thus, improve the PF of the power conversion system 100 of FIG. 1, the power conversion system 200 of FIG. 2, etc.

If, at block 1008, the controller 204 determines not to turn on the transistor(s) based on the measured current from the sense resistor, control waits at block 1008. If, at block 1008, the controller 204 determines to turn on the transistor(s) based on the measured current from the sense resistor, then, at block 1010, the controller 204 turns on the transistor(s). For example, the controller 204 can (1) turn on Q1 118 via GATE1 242, (2) turn on Q2 120 via GATE2 242 of FIG. 2, etc., and/or a combination thereof. In response to turning on the transistor(s) at block 1010, control returns to block 1002 to determine whether to turn off the transistor(s).

From the foregoing, it will be appreciated that example systems, methods, apparatus and articles of manufacture have been disclosed that improve operation of PFC circuits. Advantageously, the systems, methods, apparatus and articles of manufacture disclosed herein can measure total return current from one or more inductors using a sense resistor instead of bulkier and/or costlier components. Advantageously, the use of the sense resistor in examples disclosed herein improve the power loop of PFC circuits as circuit components such as current transformers can be eliminated from the power loop path. Advantageously, the example systems, methods, apparatus and articles of manufacture disclosed herein utilize GaN FETs that have a substantially higher VDS than forward voltage(s) of one or more return diodes, which cause an entirety of the return current to flow through the one or more return diodes instead of the GaN FETs. Thus, the example systems, methods, apparatus and articles of manufacture disclosed herein are an improvement to conventional PFC circuits that utilize Si MOSFETs.

Example methods, apparatus, systems, and articles of manufacture for current sensing in power factor correction circuits are disclosed herein. Further examples and combinations thereof include the following:

Example 1 includes a power supply circuit comprising a first Gallium Nitride (GaN) transistor having a first current terminal and a second current terminal, a second GaN transistor having a third current terminal and a fourth current terminal, a first diode having a first anode, a second diode having a second anode, the second anode coupled to the first anode, and a resistor having a first terminal and a second terminal, the first terminal coupled to the second current terminal and the fourth current terminal, the second terminal coupled to the first anode and the second anode.

Example 2 includes the power supply circuit of example 1, wherein the power supply circuit is a dual-boost semi-bridgeless power factor correction circuit.

Example 3 includes the power supply circuit of example 1, wherein the first diode and the second diode are Silicon Carbide diodes.

Example 4 includes the power supply circuit of example 1, wherein the second current terminal and the fourth current terminal are source terminals.

Example 5 includes the power supply circuit of example 1, wherein the first GaN transistor and the second GaN transistor are depletion mode GaN field-effect transistors.

Example 6 includes the power supply circuit of example 1, further including a first terminal and a second terminal to be coupled to a first inductor, and a third terminal and a fourth terminal to be coupled to a second inductor, the second terminal coupled to the first current terminal, the fourth terminal coupled to the third current terminal.

Example 7 includes the power supply circuit of example 6, wherein the first diode has a first cathode and the second diode has a second cathode, the first terminal coupled to the first cathode, and the third terminal coupled to the second cathode, and further including a third diode having a third anode, the third anode coupled to the second terminal and the first current terminal, and a fourth diode having a fourth anode, the fourth anode coupled to the fourth terminal and the third current terminal.

Example 8 includes the power supply circuit of example 1, further including a first Silicon diode and a second Silicon diode, the first Silicon diode coupled to the first current terminal, the second Silicon diode coupled to the third current terminal.

Example 9 includes the power supply circuit of example 1, further including a third diode having a first cathode, a fourth diode having a second cathode, and a capacitor coupled to the first cathode and the second cathode.

Example 10 includes the power supply circuit of example 1, wherein the resistor is a first resistor, and further including a second resistor having a third terminal and a fourth terminal, the third terminal coupled to the second terminal, the first anode, and the second anode, and a controller coupled to the fourth terminal.

Example 11 includes the power supply circuit of example 1, wherein the first GaN transistor has a first gate and the second GaN transistor has a second gate, and further including a controller coupled to the first gate and the second gate.

Example 12 includes a power factor correction circuit comprising a first Gallium Nitride (GaN) transistor having a first current terminal and a second current terminal, a second GaN transistor having a third current terminal and a fourth current terminal, a diode having an anode, a resistor having a first terminal and a second terminal, the first terminal coupled to the second current terminal and the fourth current terminal, the second terminal coupled to the anode, and a controller, the controller coupled to the second terminal, the controller to measure a voltage that corresponds to a current flowing through the resistor and the diode.

Example 13 includes the power factor correction circuit of example 12, wherein the first GaN transistor and the second GaN transistor are depletion mode Gallium Nitride field-effect transistors.

Example 14 includes the power factor correction circuit of example 12 being a dual-boost semi-bridgeless power factor correction circuit.

Example 15 includes the power factor correction circuit of example 12, wherein the voltage is a first voltage, the current is a first current having a first value in response to the controller turning on the first GaN transistor, and the controller is to measure a second voltage that corresponds to a second current flowing through the resistor and the diode, the second current having a second value in response to the controller turning off the first GaN transistor, the second value greater than the first value.

Example 16 includes the power factor correction circuit of example 12, wherein the diode is a first diode, the anode is a first anode, the first diode having a first cathode, and further including a second diode having a second anode and a second cathode, the second anode coupled to the first terminal, a third diode having a third anode and a third cathode, the third anode coupled to the first current terminal, a fourth diode having a fourth anode and a fourth cathode, the fourth anode coupled to the third current terminal, the fourth cathode coupled to the third cathode, and a capacitor, the capacitor coupled to the third cathode and the fourth cathode.

Example 17 includes a power conversion system comprising a power converter, and a power factor correction circuit coupled to the power converter, the power factor correction circuit including a first Gallium Nitride (GaN) transistor having a first current terminal and a second current terminal, a second GaN transistor having a third current terminal and a fourth current terminal, a diode having an anode, and a resistor having a first terminal and a second terminal, the first terminal coupled to the second current terminal and the fourth current terminal, the second terminal coupled to the anode.

Example 18 includes the power conversion system of example 17, wherein the power factor correction circuit is a dual-boost semi-bridgeless power factor correction circuit, and further including a controller coupled to the second terminal.

Example 19 includes the power conversion system of example 17, wherein the first GaN transistor and the second GaN transistor are depletion mode Gallium Nitride field-effect transistors.

Example 20 includes the power conversion system of example 17, wherein the resistor is a first resistor, the diode is a first diode, the anode is a first anode, the first diode having a first cathode, and the power factor correction circuit includes a second diode having a second anode, the second anode coupled to the second terminal, a second resistor having a third terminal and a fourth terminal, the third terminal coupled to the second terminal, the first anode, and the second anode, and a controller, the controller coupled to the fourth terminal, the controller to, in response to turning off the first GaN transistor, measure a voltage corresponding to a current flowing through the first resistor.

Although certain example systems, methods, apparatus and articles of manufacture have been disclosed herein, the scope of coverage of this patent is not limited thereto. On the contrary, this patent covers all systems, methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. A power supply circuit comprising:
   a first Gallium Nitride (GaN) transistor having a first current terminal and a second current terminal;
   a second GaN transistor having a third current terminal and a fourth current terminal, the fourth current terminal coupled to the second current terminal;
   a first diode having a first anode and a first cathode;
   a second diode having a second anode and a second cathode, the second anode coupled to the first anode; and
   a first resistor having a first resistor terminal and a second resistor terminal, the first resistor terminal coupled to the second current terminal and to the fourth current terminal, the second resistor terminal coupled to the first anode and to the second anode;
   a third diode having a third anode and a third cathode, the third anode coupled to the first current terminal;

a fourth diode having a fourth anode and a fourth cathode, the fourth anode coupled to the third current terminal and the fourth cathode coupled to the third cathode;

a second resistor having a third resistor terminal and a fourth resistor terminal, the third resistor terminal coupled to the third cathode and the fourth cathode;

a third resistor having a fifth resistor terminal and a sixth resistor terminal, the fifth resistor terminal coupled to the fourth resistor terminal and the fourth resistor terminal coupled to the fourth current terminal, the second current terminal, and the first resistor terminal; and a controller having a current sense input and a voltage sense input, the current sense input coupled to the second resistor terminal and the voltage sense input coupled to the fourth resistor terminal.

2. The power supply circuit of claim 1, wherein the first diode and the second diode are Silicon Carbide diodes.

3. The power supply circuit of claim 1, wherein the second current terminal and the fourth current terminal are source terminals.

4. The power supply circuit of claim 1, wherein the first GaN transistor and the second GaN transistor are depletion mode GaN field-effect transistors.

5. The power supply circuit of claim 1, wherein the first current terminal is adapted to be coupled to a first inductor and the third current terminal is adapted to be coupled to a second inductor.

6. The power supply circuit of claim 1, wherein the third diode is a first Silicon diode and the fourth diode is a second Silicon diode.

7. The power supply circuit of claim 1, further comprising a capacitor coupled to the third cathode and to the fourth cathode.

8. The power supply circuit of claim 1, further comprising:
a fourth resistor having a seventh resistor terminal and an eighth resistor terminal, the seventh resistor terminal coupled to the second resistor terminal, to the first anode, and to the second anode, and the eighth resistor terminal coupled to the current sense input.

9. The power supply circuit of claim 1, wherein the first GaN transistor has a first gate and the second GaN transistor has a second gate, the controller having a first gate output and a second gate output, the first gate output coupled to the first gate and the second gate output coupled to the second gate.

10. A power factor correction circuit comprising:
a first Gallium Nitride (GaN) transistor having a first current terminal and a second current terminal;
a second GaN transistor having a third current terminal and a fourth current terminal, the fourth current terminal coupled to the second current terminal;
a diode having an anode;
a resistor having a first resistor terminal and a second resistor terminal, the first resistor terminal coupled to the second current terminal and to the fourth current terminal, the second resistor terminal coupled to the anode; and
a controller coupled to the second resistor terminal and to the anode, the controller configured to:
measure a first voltage that corresponds to a first current flowing through the resistor and the diode, the first current having a first value in response to the controller turning on the first GaN transistor; and
measure a second voltage that corresponds to a second current flowing through the resistor and the diode, the second current having a second value in response to the controller turning off the first GaN transistor, the second value greater than the first value.

11. The power factor correction circuit of claim 10, wherein the first GaN transistor and the second GaN transistor are depletion mode Gallium Nitride field-effect transistors.

12. The power factor correction circuit of claim 10, wherein the power factor correction circuit is a dual-boost semi-bridgeless power factor correction circuit.

13. The power factor correction circuit of claim 10, wherein the diode is a first diode, the anode is a first anode, the first diode having a first cathode, and the power factor correction circuit further comprising:
a second diode having a second anode and a second cathode, the second anode coupled to the second resistor terminal;
a third diode having a third anode and a third cathode, the third anode coupled to the first current terminal;
a fourth diode having a fourth anode and a fourth cathode, the fourth anode coupled to the third current terminal, the fourth cathode coupled to the third cathode; and
a capacitor coupled to the third cathode and to the fourth cathode.

14. A power conversion system comprising:
a power converter;
a power factor correction circuit coupled to the power converter, the power factor correction circuit comprising:
a first Gallium Nitride (GaN) transistor having a first current terminal and a second current terminal;
a second GaN transistor having a third current terminal and a fourth current terminal;
a first diode having a first anode and a first cathode;
a second diode having a second anode and a second cathode, the second anode coupled to the first anode and the second cathode coupled to the first cathode; and
a resistor having a first resistor terminal and a second resistor terminal, the first resistor terminal coupled to the second current terminal and to the fourth current terminal, the second resistor terminal coupled to the first anode and to the second anode; and
a controller coupled to the power factor correction circuit, the controller configured to:
receive an input current of the power conversion system using the resistor;
receive an input voltage of the power conversion system; and
control the first GaN transistor and the second GaN transistor based on the input current and the input voltage.

15. The power conversion system of claim 14, the controller coupled to the second resistor terminal.

16. The power conversion system of claim 14, wherein the first GaN transistor and the second GaN transistor are depletion mode Gallium Nitride field-effect transistors.

17. The power conversion system of claim 14, wherein the resistor is a first resistor, and the power factor correction circuit further comprising:
a second resistor having a third resistor terminal and a fourth resistor terminal, the third resistor terminal coupled to the second resistor terminal, to the first anode, and to the second anode; and the controller coupled to the fourth resistor terminal, the controller configured to, in response to turning off the first GaN transistor, measure a voltage corresponding to a current flowing through the first resistor.

* * * * *